United States Patent [19]

Fattor

[11] 4,355,630

[45] Oct. 26, 1982

[54] CONCENTRATING SOLAR COLLECTOR WITH TRACKING MULTIPURPOSE TARGETS

[76] Inventor: Arthur Fattor, 5380 S. Holly, Englewood, Colo. 80111

[21] Appl. No.: 134,702

[22] Filed: Mar. 27, 1980

[51] Int. Cl.³ .................................................. F24J 3/02
[52] U.S. Cl. .................................. 126/438; 126/425; 126/451; 126/417; 136/246
[58] Field of Search .............. 126/417, 438, 439, 451, 126/424, 425, 450; 136/89 PC, 244, 246; 353/3

[56] References Cited

U.S. PATENT DOCUMENTS

| | | | |
|---|---|---|---|
| 2,688,922 | 9/1954 | Bonaventura et al. | 126/438 X |
| 2,976,533 | 3/1961 | Salisbury | 126/424 |
| 4,022,188 | 5/1977 | Cohen et al. | 126/438 |
| 4,071,017 | 1/1978 | Russell, Jr. et al. | 126/438 X |
| 4,111,360 | 9/1978 | Barr | 126/438 |
| 4,158,356 | 6/1979 | Wininger | 126/438 |
| 4,166,446 | 9/1979 | Youngs | 126/438 |
| 4,173,397 | 11/1979 | Simpson | 126/438 X |
| 4,217,884 | 8/1980 | Strong | 126/438 |

*Primary Examiner*—Larry Jones
*Attorney, Agent, or Firm*—Kyle W. Rost

[57] ABSTRACT

A parabolic solar concentrator whose focused solar rays impinge as a line focus upon one or more daily and seasonably tracking target collectors made to move generally parallel along two or more tracks through the use of sensor activated motors.

8 Claims, 8 Drawing Figures

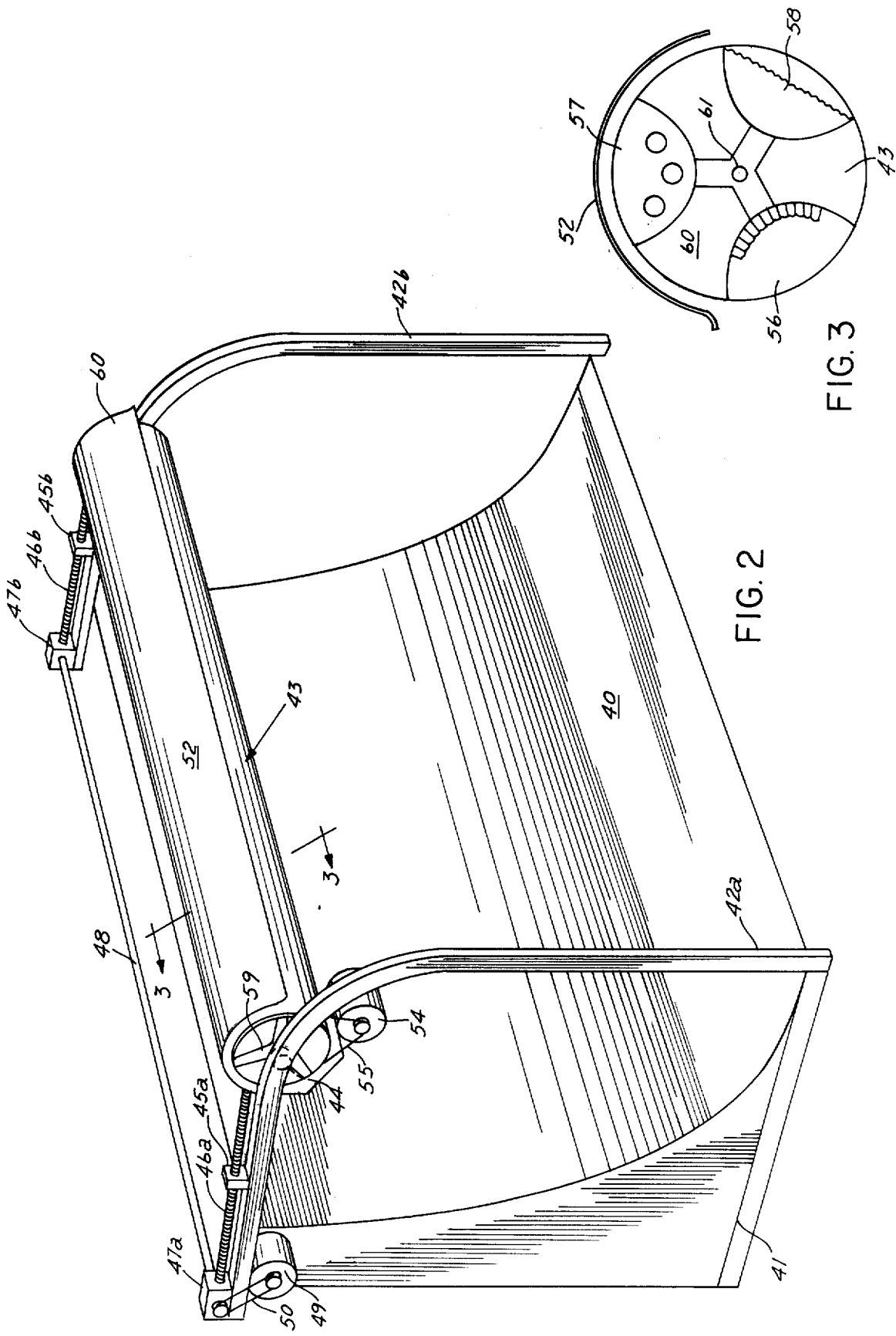

CONCENTRATING SOLAR COLLECTOR WITH TRACKING MULTIPURPOSE TARGETS

This invention relates to a concentrating parabolic mirror in which focused solar radiation is made to impinge upon one of a series of positionable targets, with each target arranged for a specific energy generating function, said target arrays being moveable along a series of tracks to line up with the maximum solar flux at various seasons of the year.

Prior Art

Parabolic, concentrating mirrors have been used for producing line focused sun's rays. Positioning the mirror permits the use of an over-head target to receive the concentrated rays. For example, in my U.S. Pat. No. 4,015,585 there is described a single, fixed position parabolic concentrating mirror, with an overhead target of sufficient width to accept solar radiation at all seasons throughout the year. In my U.S. Pat. No. 4,173,214, I describe a plurality of parabolic concentrating mirrors mounted on a slope and overlapped. The separate mirrors have separate target systems mounted overhead, in a fixed position, with the width of the target system sufficiently wide and positioned, to provide a target at all seasons of the year.

Parabolic trough mirrors are shown in U.S. Patent No. 4,000,734, in which each troughs are arranged to daily track the sun's position so as to maintain the generated line focus on the single target.

A parabolic concentrating mirror forms one large section of a structure's roof in U.S. Pat. Nos. 4,004,574, and in 4,111,360 (a division of the 4,004,574 patent). A large target mounted on a pivoted U-frame is superimposed over the mirror. Being pivoted at the lower ends of the legs of the U-frame, the target is moved on a circular arc, providing a compromise in location of the target as to the actual line focus of the mirror. Thus, the target may be above or below the maximum concentration of the sun's rays at various times of the year. A single sensor tends to keep the target at the hottest position available along the arc.

A stationary spherical reflector is shown in U.S. Pat. No. 4,137,902, having an elongated tube extending outwardly from the center. The tube is oscillated to be in a better position for the focus point or near focus of the sun's rays from the spherical reflector.

The Present Invention

The present invention provide a parabolic mirror positioned to direct concentrated solar rays upwardly in a line focus. A movable, single or multiple target array is mounted above the mirror on a somewhat circular tract to absorb the focused rays. The target array includes a series of elongated, relatively narrow targets, generally in side-by-side relation, a single accept the line focus of the mirror. The choice of target is at the operators discretion. The series is arranged to position one of the targets in position for absorbing the maximum heat of the line focus. The series is mounted to move along a track means so that any one of the series may be on the focus line. Each separate target has a specific energy generating function, i.e. converting absorbed solar radiation into hot liquid, steam or hot air; photovoltaic electric generation, etc. Each target is regulated by a heat-activated sensor controlling a drive mechanism for aligning the target with the concentrated rays when activated. Where desired, the mirror also may be mounted so as to be tilted into the optimum angle to the sun's rays at the different seasons. However, the track mounting of this invention generally obviates this need.

OBJECTS AND ADVANTAGES OF THE INVENTION

Included among the objects and advantages of the present invention is to provide a means of tracking the suns reflected line focus from a parabolic trough mirror on targets mounted to follow along two or more generally circular tracks.

Another object of the invention is to provide plural targets for a solar radiation concentrator means, where each target is controlled by a sensor to the exclusion of the other sensors, providing single target operation.

Yet another object of the invention is to provide a parabolic mirror for producing a line focus, and a plurality of targets for accepting the line focus, with each target arranged for a specific energy generating function, and the plurality of targets are arranged for single target operation.

Still another object of the invention is to provide a concentrating parabolic mirror producing a line focus of solar rays, and a plurality of overhead targets individually controlled by a sensor for positioning a selected single target for absorbing the line focus and to maintain such target at the line focus through different seasons of the year.

An additional object of the invention is to provide a concentrating parabolic mirror and a plurality of side-by-side targets for singly absorbing concentrated rays, and including a single motor moving means for maintaining a selected absorber in the line focus at various seasons.

A further object of the invention is to provide a plurality of side-by-side concentrated solar ray absorbers arranged to track variations in the focus line occuring as the sun's angle changes daily and at various seasons of the year.

A still further object of the invention is to provide plural solar radiation absorber targets arranged in a circular manner in a protected housing and brought into line focus by rotating the unit. All of which may be easily removed individually for service.

These and other objects and advantages of the invention may be ascertained by reference to the following description and appended illustration.

GENERAL DESCRIPTION OF THE DRAWINGS

FIG. 2 is a isometric view of a modified tracking mechanism for a target assembly above a reflective surface.

FIG. 3 is a schematic side elevation of the target array of FIG. 2.

DETAILED DESCRIPTION OF THE DRAWINGS

Figure 1:
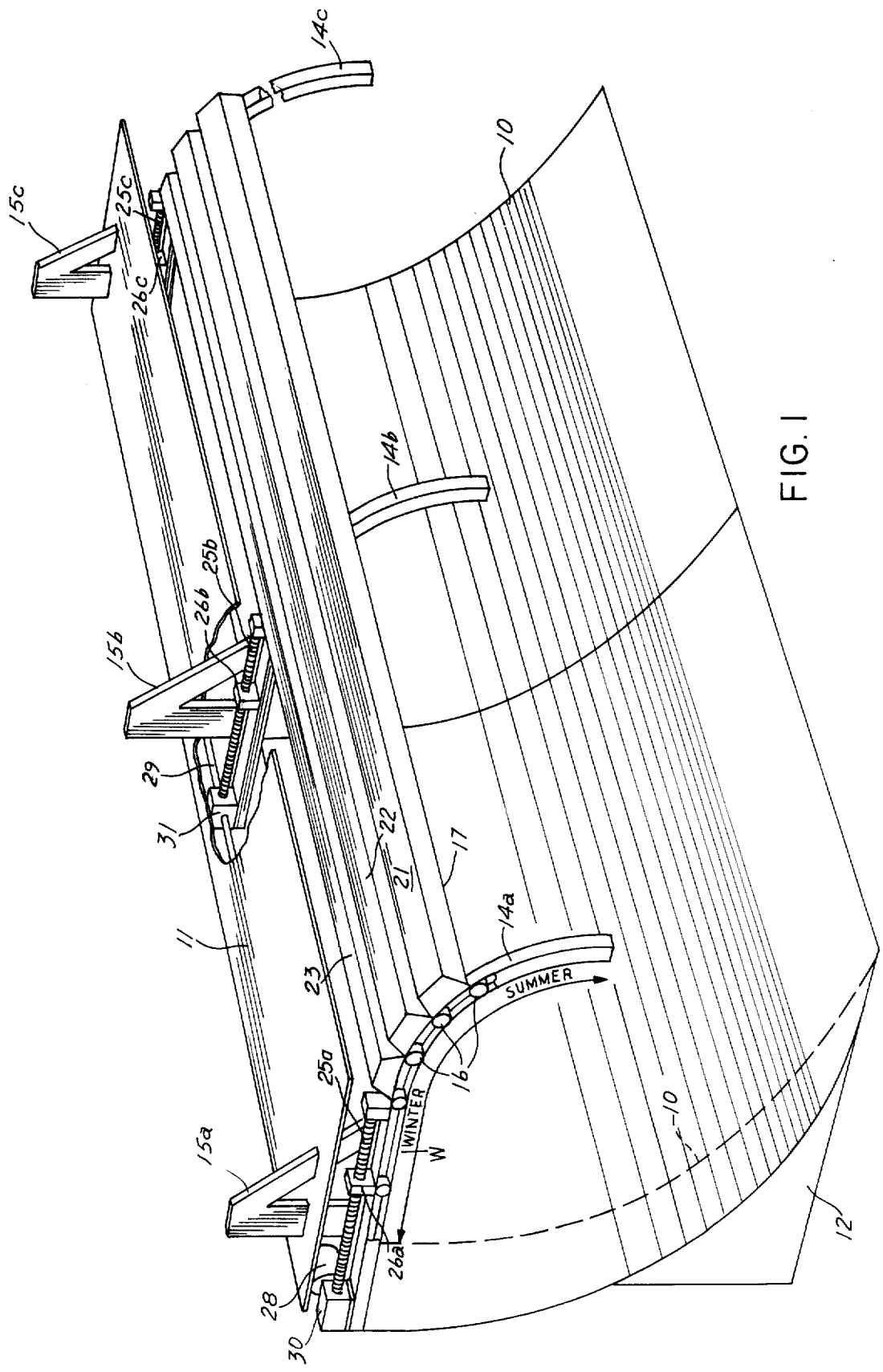
FIG. 1 is an isometric view of one form of a concentrating solar reflector and multiple target assembly mounted for tracking movement above the reflector, according to the invention.

In the device selected for illustration of FIG. 1, a parabolic mirror, 10, generally one side of a parabola, is mounted in an upright position. Preferably, the reflector mirror 10 is mounted on a base 12 which permits a variable angle mounting of the mirror, as shown by the dashed line 10, indicating that the mounting angle of the mirror may be at a compromise angle between the optimum angle with a low sun (in the northern hemisphere- a winter sun) to the optimum angle with a high sun (summer sun in the northern hemisphere). The optimum angle is that which produces a focal line at a desired position with maximum concentration. The mirror is, preferably, not a daily sun tracking unit, but may be a seasonal trackong unit, explained below. The mirror may be any highly reflective surface which is durable in the climate conditions of the locale, including moisture, dirt, cold and heat conditions. The material may be sheet metal formed into shape, including such metals as steel; coated steel, as by chromium, etc. aluminum, plain or coated; glass (mirrored); plastic; or the like. The surfaces may be coated with reflective material and overcoated with a clear protective coating material.

The framework supporting the mirror must be capable of withstanding the winds in the locale, as a substantial frontal surface is presented. The mirror is supported in an upright position so as to concentrate solar radiation reflected from the mirror surface into a line focus at an angle above the mirror surface. A target system is mounted above the mirror, on its framework, and, or course, the target system must be able to withstand the winds of the locale.

One target system is shown in FIG. 1, where three generally parallel tracks 14a, 14b and 14c are cantilevered above the mirror, on brace supports 15a, 15b and 15c respectively. Each track may effectively be a channel or similar rails, reciprocably holding carriage wheels 16 secured to an articulated carriage 17 formed of 3 targets 21, 22 and 23 mounted for movement along the tracks. In one form, the housing members for the absorbers are hingedly joined together and mounted on wheels that fit in the channels. They may be removable units mounted on an articulated carriage for easy maintenance. Movement along the arcuate track causes articulation of the housings. The tracks are arced in a shape so that the targets are maintained at the focal line or optimum distance above the particular mirror for maximum heat absorption. The carriage or target assembly travels in a gradual movement from season to season from point W (winter sun angle) to the lower end of the tracks at summer sun angle. A drive mechanism for the carriage includes jack screws 25a, 25b and 25c and jack screw runners 26a 26b and 26c mounted on the tracks and the respective jack screw. The target carriage is secured to each runner by wheel connectors securing the wheels and runner together. An electric motor 28 rotates an elongated shaft 29. The shaft 29 is connected to angle gear box 30, through angle gear box 31 and angle gear box 32. The jack screws are connected to the respective gear box so that rotation of the main shaft is transmitted through the gear boxes for conjoint rotation of the jack screws. Movement of the runners along the jack screws moves the carriage. The gear boxes and threads of the screws are compatable to equally move the elongated targets maintaining the targets in alignment with the line focus of the mirror. A cover or protective housing 11 depends outwardly from the top edge of the mirror 10 a distance sufficient for the housing assembly to be housed thereunder at night. Thus, a light sensor is arranged to activate the motor to move the targets under the protective housing as the sun sets, goes under a cloud, etc.

Figure 5:
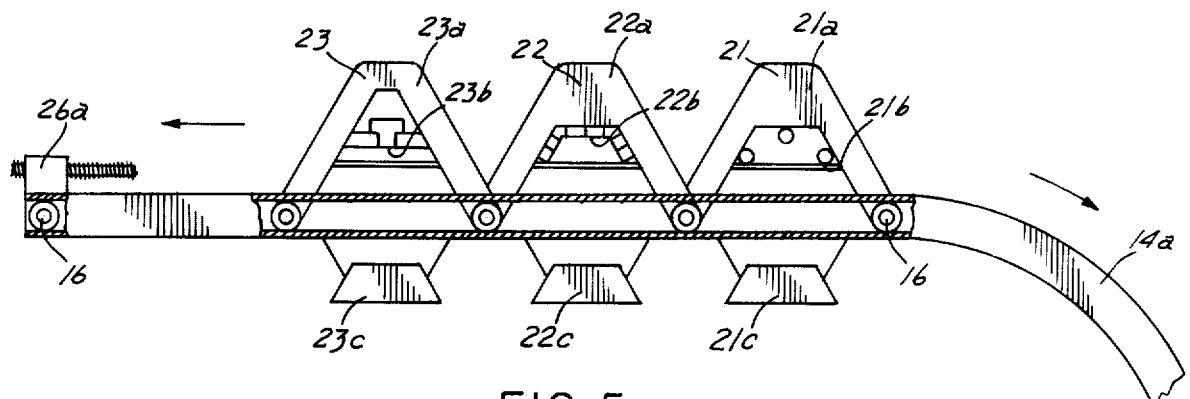
FIG. 5 is a cut-away side elevational view of a multiple target, solar energy absorber system, illustrating one form of tracking and moving system for the absorbers.

The targets in one form are preferably of 3 different types of energy generating units. As shown in FIG. 5, Target 21 includes an insulated housing 21a for fluid carrying tubes 21b for producing hot water, steam, or provide heated fluid for an absorptive-type air conditioning system. Target 22 includes insulated housing 22a for photovoltaic cells 22b as an electric generating unit. The target 23 includes insulated housing 23a with an absorbing surface 23b of a deformed absorber (increased surface type) for producing hot air.

Figure 6:
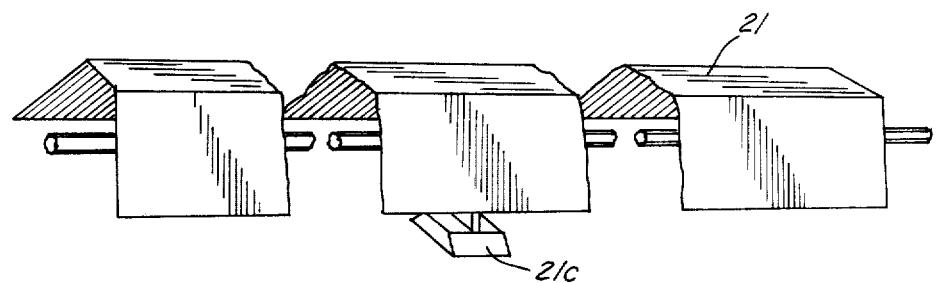
FIG. 6 is a front elevational detail, partially cut away, of a modified target assembly accoring to one form of the invention.

The rollers 16 are secured together as by connecting rods (similar to an articulated garage door) for conjoint movement along the track. Sensors 21c, 22c and 23c are mounted on the under side of targets 21, 22 and 23 respectively for actuating the motor 28 to align a specific target for maximum solar flux. The sensors are mounted at about midspan of the targets, as shown in FIG. 6. The sensors are singly activated, at the desire of the operator, to position a particular one of the targets in the line focus of maximum solar flux. The particular sensor activates the motor to maintain the target a maximum solar flux. The operator may change the targets as desired, for example, by deactivating the sensor on the photovoltaic cells for a change of the electric energy and activating the sensor on the fluid line target to produce hot water.

Other drive mechanisms may be used to move the target array in accordance with a sensor's activation. Also, the targets may be covered with tempered high-heat resistant glass if desired.

In the modified unit of FIGS. 2 and 3 a parabolic mirror 40 is mounted upright in frame 41, arranged to hold the mirror in the upright position. A pair of tracks or rails 42a and 42b extend, in a predetermined curve, from the upper edge to the lower edge of the mirror. A rotary target array, shown generally by number 43, is mounted on rollers 44 for permitting movement of the target along the tracks, following the line focus of concentrated rays. The rollers are attached to a connecting rod (not shown) mounted adjacent the track, and the rod is in turn connected to jack screw runners 45a and 45b mounted on jack screws 46a and 46b. Each jack screw is operatively connected to a gear box 47a and 47b respectively. A shaft 48 between the boxes provides for conjoint rotation of the jack screws. The shaft 48 extends through the gear box 47a and is driven by a motor 49 (through chain drive-sprocket drive assembly 50). A sensor (not shown) mounted under the targets, in a manner similar to FIG. 1, maintains the target assembly in the line focus of the mirror.

The target assembly is mounted with three spaced separate targets mounted between the end wheels of the assembly. The assembly is covered by a weather shield 52, which maintains its position, protecting the target array. The target array is turned by a motor 54 and chain-sprocket drive assembly 55, to place the desired target in the line focus of the mirror. The array is schematically shown in FIG. 3, where the array 43 includes a photovoltaic absorber 56 in an insulated housing, fluid lines absorber 57, and an absorber 58 to produce hot air (all in the manner of FIG. 1). These are held on end plates 59 and 60 mounted on a shaft 61 turned by the chain drive 55.

The unit of FIG. 2, has an advantage of a smaller blocking profile for incident solar rays. This permits more solar rays to reflect from the mirror to the target. The mirror may be made movable to track the season-to-season sun for more efficiency.

Figure 4:
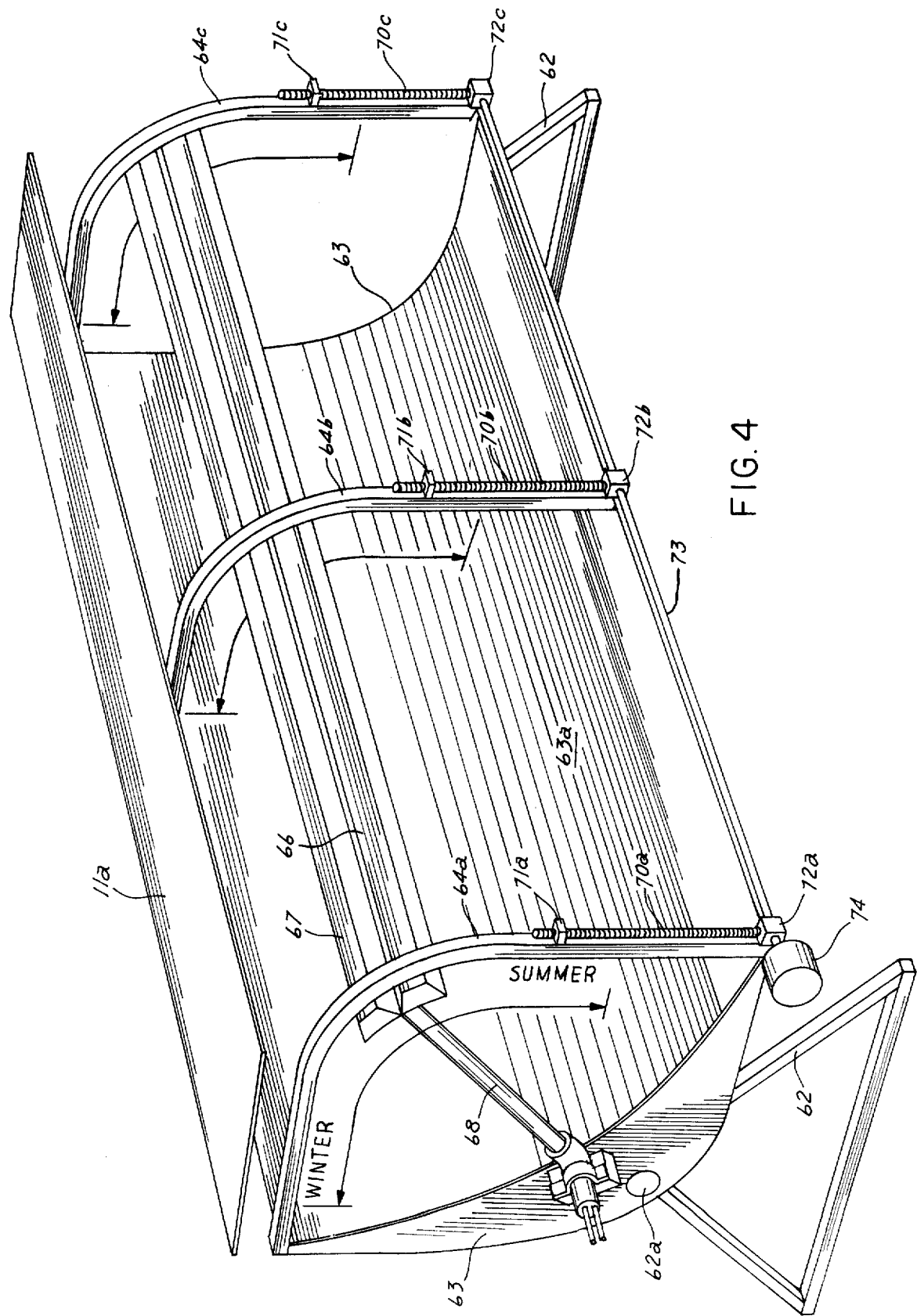
FIG. 4 is an isometric view of a further modified, tiltable reflective surface and an overhead tracking target assembly.

The device of FIG. 4 includes pivotal supports 62, with pivots 62a for supporting a mirror framework 63 in which a mirror 63a is mounted. As many of the supports 62 as are necessary to support the unit under weather conditions of the locale are used. The mirror frame may be manually turned for seasonal solar tracking, or it may be automatic, using time, light or other sensors, in a conventional setup. Tracks 64a, 64b, and 64c arc along the portion of the optimum path of solar line focus, from top to bottom of the mirror. A pair of targets 66 and 67 are mounted on rollers, at each end, in the tracks, as explained for FIG. 1. Lines to and from the targets pass through a conduit 68 pivoted on the frame 62 and connected to the targets to supply and retrieve fluid, electrical current, etc. The targets are moved along the arced portion of the tracks by jack screws 70a, 70b and 70c. The jack screws are mounted in gear boxes 72a, 72b and 72c, driven by shaft 73. Jack screw runners 71a, 71b and 71c are connected to the targets, and the runners are, of course, moved by the jack screws. The motor 74 is controlled by the similar sensor array as for FIG. 1, or an equivalent. The sensors for any of the units may either heat sensors or photo cells, and the drive motors must be reversible so as to move the targets in both directions.

Figure 7:
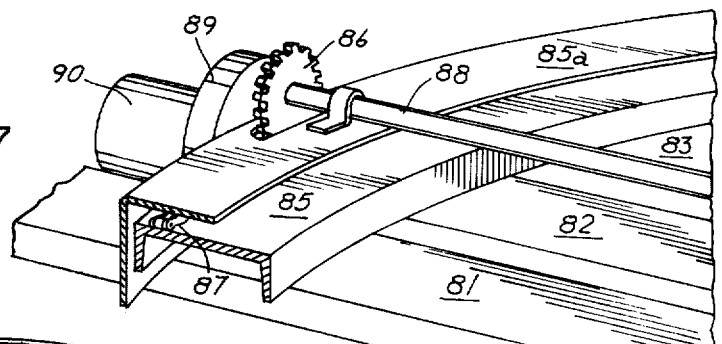
FIG. 7 is a detailed perspective of a modified target moving device.
Figure 8:
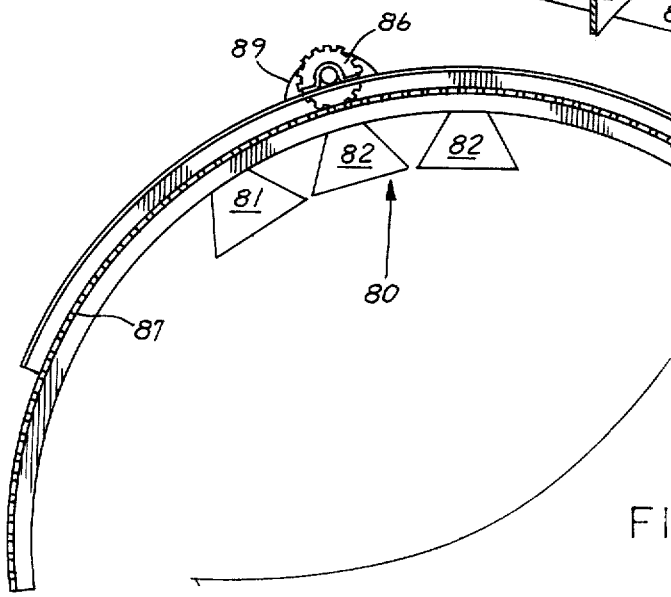
FIG. 8 is an end elevational view of the device of FIG. 7.

The means for moving the targets may be any means controllable by an electric motor. Jack screws are shown as one method of moving the carriages for the targets. A chain-sprocket means is another method of moving the target carriage. As shown in FIG. 7 and 8, a target array, shown generally by number 80, similar to the array of FIG. 1, consists of targets 81, 82 and 83. The array is moved along tracks 85 by a sprocket 86 meshed with chain 87 fixedly mounted on the track 85. A shaft 88, mounted on track cover member 85a, is secured to and rotated by gear reducer 89 which is driven by a motor 90. The array 80 is mounted on the downwardly depending flange of the angle cover member 85a and, thus, moves with it. The cover member shields the chain against inclement weather and protects it from the elements. The shaft 88 extends across the mirror on two or more tracks. The sprocket-chain arrangement on each track drives the target array generally parallel to the line focus. The targets ride on two or more tracks and are moved along by the rotation of sprockets, one per track member, on fixed positioned line chains attached to two or more track members.

The units of the various modifications provide easy access to the reflective mirror surfaces for maintainence and replacement, if necessary. The mirror is easily serviced, as for ice and snow removal, washing for dust and dirt removal, etc. Also, the targets are easily accessible for service or replacement. In addition, any target may be replaced by a different energy generating target unit, where it is determined that such a change would be beneficial or desirable.

What is claimed is:
1. A solar energy collector comprising:
   (a) a reflective surface means positioned so as to be nonmovable and having such a curvature as to produce a line focus of solar radiation at any incident angle of the sun's rays,
   (b) plural collector target means mounted above said reflective surface means in a plurality of substantially separate housings, any one of such target means being capable of being positioned to accept a line focus, and each target means being capable of generating a distinct form of energy as distinguished from the other target means,
   (c) plural track means having a concave, reverse curvature with respect to the reflective surface means, on which is mounted said plural target means over said reflective surface means and providing a path of movement for said target means to intercept maximum solar reflected flux at various seasons of the year,
   (d) means for moving said plural target means to position one of said target means in said line focus so as to energize said target means, and
   (e) means for recovering a specific generated energy form from said one of said target means.

2. A solar energy collector according to claim 1 wherein said reflective surface means is an elongated parabolic trough mirror.

3. A solar energy collector according to claim 1 wherein said plural target means are side-by-side array.

4. A solar energy collector according to claim 1 wherein said plural target means are formed into a rotatable, peripheral array.

5. A solar energy collector according to claim 1 wherein said plural track means are arched structural members in reverse configuration to said reflective surface means, supporting movable carriages attached to said plural target means.

6. A solar energy collector according to claim 1 wherein housing means are provided for said collector target units so that the targets may be moved in protected position during inclement weather.

7. A solar energy collector according to claim 1 wherein each of the plural track means are of concave curvature to said reflective surface means having a profile such that said one of said target means can be precisely positioned above the reflective surface means for reception of maximum solar flux at any incident angle of the sun's rays.

8. A solar energy collector according to claim 1 further comprising:
   plural means for sensing solar rays and for activating said moving means in response to said sensing so as to align and maintain said one of said target means in said line focus, each of said sensing and activating means being individually mounted on separate target means.

* * * * *